United States Patent [19]

Shimbo

[11] Patent Number: 4,635,089
[45] Date of Patent: Jan. 6, 1987

[54] MIS-INTEGRATED SEMICONDUCTOR DEVICE

[75] Inventor: Masafumi Shimbo, Tokyo, Japan

[73] Assignee: Kabushiki Kaisha Daini Seikosha, Tokyo, Japan

[21] Appl. No.: 831,063

[22] Filed: Feb. 19, 1986

Related U.S. Application Data

[63] Continuation of Ser. No. 430,991, Sep. 30, 1982.

[30] Foreign Application Priority Data

Oct. 28, 1981 [JP] Japan .................... 56-172334

[51] Int. Cl.[4] .............. H01L 27/12; H01L 29/78; H01L 27/02; H01L 29/06
[52] U.S. Cl. ......................... 357/42; 357/4; 357/231; 357/41; 357/45; 357/56
[58] Field of Search ............... 357/4, 23.1, 23.7, 41, 357/42, 45, 56, 59 R, 59 E, 91

[56] References Cited

U.S. PATENT DOCUMENTS

| | | | |
|---|---|---|---|
| 4,161,417 | 7/1979 | Yim et al. | 357/42 |
| 4,472,871 | 9/1984 | Green et al. | 357/91 |
| 4,487,639 | 12/1984 | Lam et al. | 357/42 |

FOREIGN PATENT DOCUMENTS

| | | | |
|---|---|---|---|
| 930477 | 7/1973 | Canada | 357/42 |
| 53-118986 | 10/1978 | Japan | 357/42 |
| 55-62771 | 5/1980 | Japan | 357/42 |
| 55-74172 | 6/1980 | Japan | 357/42 |
| 55-105361 | 8/1980 | Japan | 357/42 |
| 56-62356 | 5/1981 | Japan | 357/42 |
| WO81/00489 | 2/1981 | PCT Int'l Appl. | 357/55 |

OTHER PUBLICATIONS

L. M. Terman, "Combining Bipolar and FET Devices on a Single Silicon Substrate", IBM Technical Disclosure Bulletin, vol. 11 (1969), pp. 1270–1271.

Primary Examiner—J. Carroll
Attorney, Agent, or Firm—Robert E. Burns; Emmanuel J. Lobato; Bruce L. Adams

[57] ABSTRACT

The present invention aims to form a MOST, for example a MOS-SIT, whose impurity density in a channel region is lower than an ordinary MOST on a substrate or is formed in an epitaxial growth layer on a well.

2 Claims, 8 Drawing Figures

MIS-INTEGRATED SEMICONDUCTOR DEVICE

This is a continuation of application Ser. No. 430,991 filed Sept. 30, 1982.

BACKGROUND OF THE INVENTION

The present invention relates to a MIS integrated semiconductor device in which two or more insulating gate (MIS) transistors having the same conductivity channels of different impurity density in the channel region are mounted on one chip.

More particularly, the present invention relates to the structure of a MIS integrated circuit in which a complementary MIS (CMIS) transistor and a MIS static induction transistor (SIT) are mounted on one chip.

Recently a demand for MIS integrated circuits, especially for MOS integrated circuits, has been increasing because of its simple design and stable manufacturing processes. Of these, a CMOS is chiefly used for watches, portable calculators, etc. because of its low power consumption at low-speed or direct-current operations. Although the CMOS is inferior to a bipolar transistor IC at a high-speed operation in the present state of development, improvements in high-speed operation and power consumption have been made by the recent advent of a punch-through MOS or a MOS-SIT. The advent of the IC with excellent performance both at a high speed and a low speed and with low power consumption is extremely advantageous in increasing the IC function and obtaining a circuit of optimum design.

The MOS-SIT is operable by shortening the gate length in comparison with the ordinary MOS transistor (MOST) to form a depletion layer between a source and a drain and forming an electric potential barrier in front of the source. If the MOST and MOS-SIT are formed by an identical design rule, however, it is simpler to lower the impurity density in the channel region at the SIT side. For that the MOS-SIT is formed on a high-resistant substrate and the MOST is formed inside a well, but the use of the high-resistant substrate often causes incomplete isolation between the elements, or a sufficient plane distance for isolation should be left. When the MOS-SIT is incorporated in a P-well in an n-type substrate, for example, it is generally more difficult to lower the density in the P-well than in the substrate and also latch-up easily occurs.

SUMMARY OF THE INVENTION

It is an object of the present invention to form a MOST, for example a MOS-SIT, whose impurity density in a channel region is lower than that of an ordinary MOST on a substrate and which is formed in an epitaxial growth layer on a well. It is more preferable in view of workability and treatment of the latter processes to use a single crystal layer formed by a non-single crystal layer (amorphous or polycrystalline) semiconductor thin film grown by Solid-Phase Epitaxy (referred to as SPE hereafter).

DETAILED DESCRIPTION OF PREFERRED EMBODIMENTS

The present invention provides the structure and method of manufacturing both an ordinary MOS transistor and a MOS-SIT mounted on one chip through simple processes.

Hereinafter the present invention will be illustrated in detail in conjunction with the drawings.

Figure 1A:
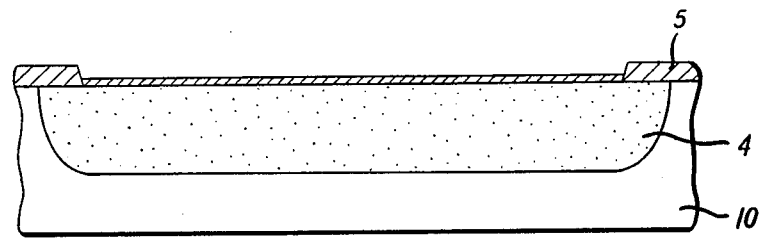
FIGS. 1-$a$-$c$ show sectional views for illustrating the processes of the integrated circuit on which MOST and MOS-SIT are mounted, according to the present invention.
Figure 1B:
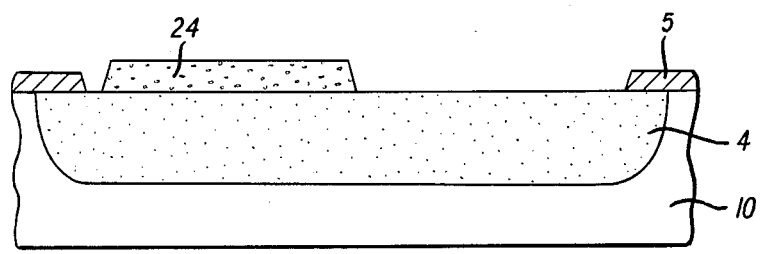
Figure 1C:
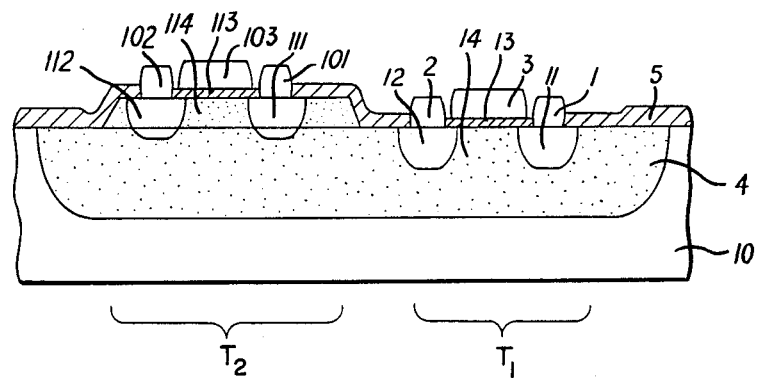

FIG. 1$a$-$c$ are general views of fragmentary typical sections showing the processes of a MIS integrated circuit according to the present invention. FIG. 1$a$ shows a section in which a P-well 4 is formed on an n-type Si substrate 10 by ion implantation and diffusion of boron. The substrate 10 has normally a (100) surface, and the impurity density is around $10^{15}$ cm$^{-3}$. The P-well 4 has a surface density of $10^{15}$-$10^{17}$ cm$^{-3}$, which is normally higher than the substrate, and the depth of diffusion is around 2-10 $\mu$m. FIG. 1$b$ shows a section in which an oxide window for the region to form the MOS-SIT hereafter is opened and a non-single crystal (amorphous or polycrystalline) Si thin film 24 is deposited on the region, and the unnecessary parts of the film are eliminated.

Although a window-opening of an oxidation film 5 is provided on the overall surface of the P-well 4, only a necessary part may be selectively opened. A non-single crystal Si thin film 24 is deposited by a plasma CVD, grow electric discharge, reduced pressure or atmospheric pressure CVD, evaporation or the like. It is preferable that the grain size is small in the case of polycrystal film. It has been shown by experiments that the condition of depositing the non-single crystal Si thin film under a reduced pressure and at a temperature of less than 650° C. is preferable. The impurity density of the intrinsic, n-type or p-type thin film 24, lower than that of the P-well 4, is $10^4$-$10^{14}$ cm$^{-3}$. The typical thickness of the thin film 24 is 0.2-2 $\mu$m and preferably less than 1 $\mu$m for the latter processes. After the step of FIG. 1$b$, the thin film 24 is subjected to thermal treatment under a non-oxidation atmosphere such as hydrogen, nitrogen, helium, argon, or vacuum in a radiation such as laser or electron beams, or thermal furnace. The thin film 24 becomes a single crystal layer 114 by SPE and simultaneously it becomes a P-type of low impurity density determined by the diffusion from the P-well 4 under the thermal treatment of 1000°-1200° C. for several tens of minutes. Although the gaseous phase CVD method, the liquid phase method, etc. are applicable to the epitaxial growth, SPE is most suitable in view of the auto-doping, the shape of the surface, etc.

The impurities may be added to the single crystal layer 114 as necessary. After that, n$^+$ source and drain regions 11, 12 of MOST T$_1$, n$^+$ source drain and regions 111, 112 of MOS-SIT T$_2$, and gate oxidation films 13, 113 thereof are simultaneously formed respectively, and the MOST T$_1$ is formed on the P-well 4, and the MOS-SIT T$_2$ is formed on the single crystal layer 114 on the P-well 4 by the contact window-opening and the wiring process as shown in FIG. 1$c$ by the ordinary MOS process. The MOST T$_1$ and MOS-SIT T$_2$ have the source electrodes 1, 101, drain electrodes 2, 102, and gate electrodes 3, 103 respectively.

There are few problems in manufacturing the MOST T$_1$ and MOS-SIT T$_2$ since the surface has the height difference of less than 1 μm. Since the P-well 4 whose impurity density is relatively high is provided at the lower portion of the p-channel region 114, latch-up hardly occurs and the isolation between the elements can be made as in the conventional MOS.

Although the present invention has been illustrated with respect to the n-channel MOST and MOS-SIT in the P-well, it is similarly applicable to the P-channel in the n-substrate or n-well.

Figure 2A:
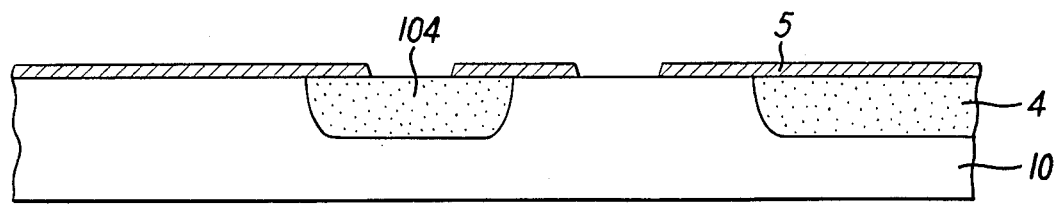
FIGS. 2$a$-$e$ show sectional views for illustrating another manufacturing processes of the CMOS-SIT according to the present invention.
Figure 2B:
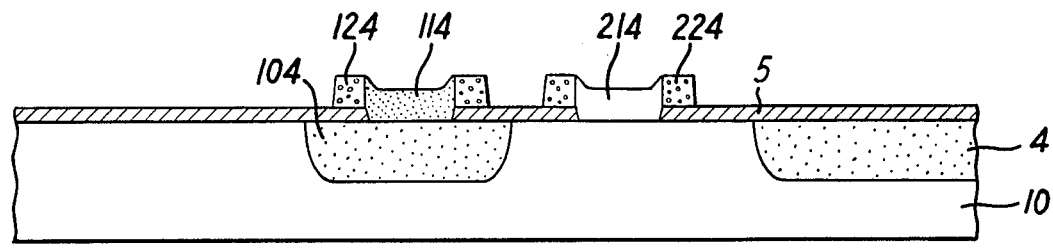
Figure 2C:
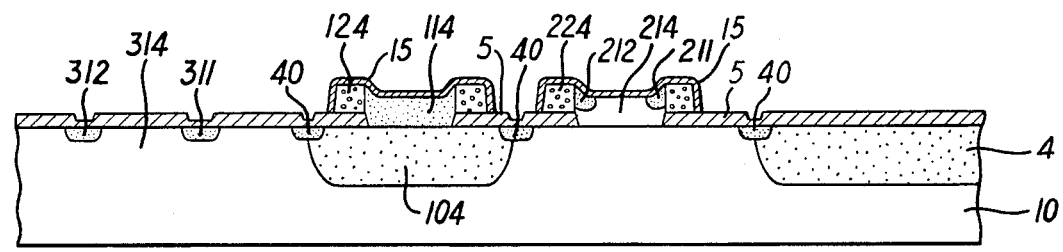
Figure 2D:
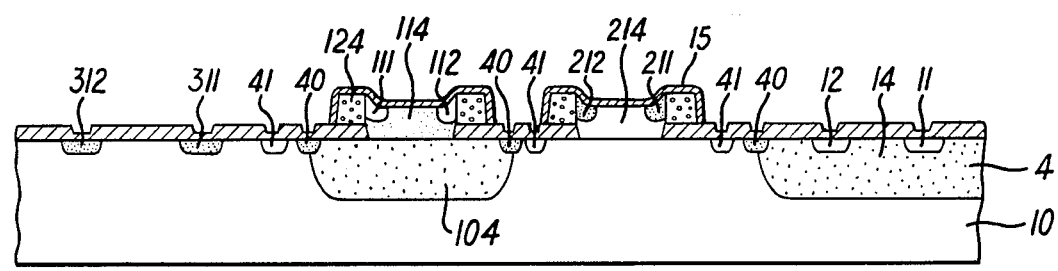

Subsequently a manufacturing method of an integrated circuit including CMOS SIT and CMOST will be illustrated in conjunction with FIGS. 2a–2e. FIG. 2a shows a section in which the P-wells 4, 104 are formed in the n-type substrate 10, and the oxidation film 5 with opened windows on the P-well 104 and the substrate 10 is formed. Then a non-single crystal layer is deposited, and crystal layers 114 and 214 are formed on the window-openings of the oxidation film 5 by SPE before or after the selective etching as shown in FIG. 2b. On this occasion the single crystal layer is formed on the window-openings and the periphery thereof of several μm, and the poly-crystal layer is formed on the oxidation layer 5 which may serve as a part of the wiring. Thus poly-crystal layers 124 and 224 remain as shown in FIG. 2b. Although SPE can be made by annealing the overall surface of the substrate by CW laser, electron beam, thermal furnace. etc, the selective annealing by laser or electron beam is also effective. FIG. 2c shows a section in which P+ source and drain regions 211 and 212 of P-channel MOS SITT$_4$, P+ source and drain regions 311 and 312 of P-channel MOST T$_3$, poly-crystal layers 124 and 224 channel cut portions 40 are formed by the selective diffusion of boron. FIG. 2d shows a section in which n+ source and drain regions 111, 112 of n-channel MOS SITT$_2$, n+ source and drain regions 11 and 12 of n-channel MOST T$_1$, poly-crystal layers 124 and channel cut portions 41 are formed simultaneously.

Figure 2E:
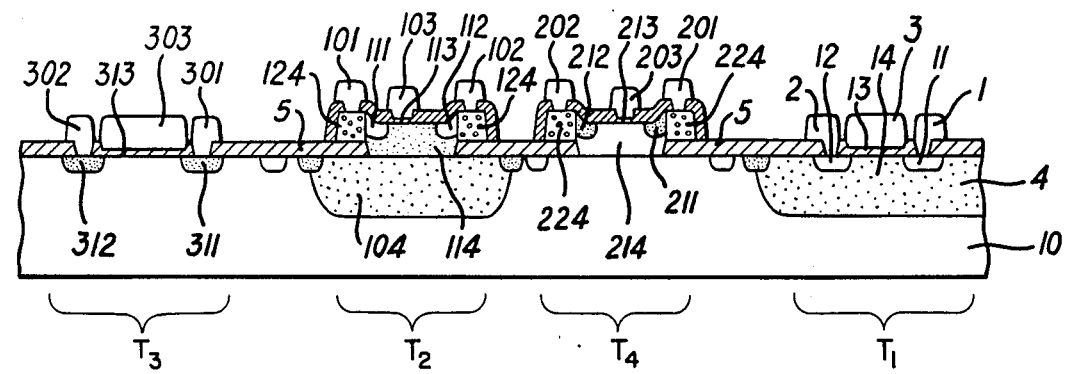

Then after the growth of gate oxide film growth films 13, 113, 213, 313, contacts are opened, wiring is made including the formation of gate electrodes 3,103,203,303 and the CMOS SIT T2 and T4 and the CMOST T1 and T3 are simultaneously formed (FIG. 2e). The embodiment in FIG. 2 is advantageous in that the poly-crystal layers 124, 224 on the oxide film 5 can serve as a part of the wiring for the contact formation region whereby the parasitic capacity is also reduced.

As illustrated, the MOS SIT is formed inside a comparatively thin single crystal layer of low impurity density on the region formed simultaneously with the channel region of the MOST (FIG. 2) or the region elongated therefrom (FIG. 1), according to the present invention. The MOST of low channel region density is also formed in a similar manner as the MOS SIT. Although the present invention has been illustrated by way of the n-type substrate, it is to be noted that the invention is applicable to the p-type substrate. The material is not restricted to Si but other materials such as GaAs can be used. Further, it is to be noted that the present invention is applicable not only to the process using Al metal as the gate electrode but also the process using Si or a metal of high melting point, and the process using nitride film as well as the oxide film as the gate insulating film.

The present invention is effective to increase functions and performances of the integrated circuit and contributes to the progress of industry.

I claim:

1. A MIS integrated semiconductor device comprising: one chip having thereon a first MIS transistor comprising an insulating gated field effect MIS transistor having a first channel region of one conduction type comprising a portion of a first well of the one conduction type formed in a substrate crystal of an opposite conduction type to said one conduction type, first source and drain regions of said opposite conduction type formed in said first well, a first gate insulating film on said first channel region and a first gate electrode on said first gate insulating film, and also on the one chip a second MIS transistor comprising a MIS static induction transitor having a second channel region of said one conduction type with an impurity concentration lower than that of said first channel region, second source and drain regions of said opposite conduction type formed in said second channel region in spaced-apart relation along the length direction thereof, a second gate insulating film on said second channel region, and a second gate electrode on said second gate insulating film and having a narrower width in said length direction than the length of said second channel region between said second source and drain regions, wherein said second channel region comprises a solid-phase epitaxial layer grown on a second well of said one conduction type formed simultaneously with said first well or on an elongated portion of said first well and has an impurity concentration determined by the impurity diffusion from said second well or said elongated portion of said first well.

2. A MIS integrated semiconductor device according to claim 1; wherein the one chip also has thereon a third MIS transistor having a third channel region of said opposite conduction type comprising a portion of said substrate, third source and drain regions of said one conduction type formed in said substrate, a third gate insulating film on said third channel region and a third gate electrode on said third gate insulating film and also on the chip a fourth MIS transistor comprising a MIS static induction transistor having a fourth channel region of said opposite conduction type with an impurity concentration lower than that of said third channel region, fourth source and drain regions of said one conduction type formed in said fourth channel region in spaced-apart relation along the length direction thereof, a fourth gate insulating film on said fourth channel region, and a fourth gate electrode on said fourth gate insulating film and having a narrower width in said length direction than the length of said fourth channel region between said fourth source and drain regions, wherein said fourth channel region comprises a solid-phase epitaxial layer grown on said substrate simultaneously formed with said second channel region and has an impurity concentration determined by the impurity diffusion from said substrate.

* * * * *